(12) United States Patent
Kim

(10) Patent No.: US 7,512,018 B2
(45) Date of Patent: Mar. 31, 2009

(54) COLUMN ADDRESS ENABLE SIGNAL GENERATION CIRCUIT FOR SEMICONDUCTOR MEMORY DEVICE

(75) Inventor: Bo-Yeun Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 94 days.

(21) Appl. No.: 11/819,948

(22) Filed: Jun. 29, 2007

(65) Prior Publication Data

US 2008/0159057 A1 Jul. 3, 2008

(30) Foreign Application Priority Data

Dec. 27, 2006 (KR) .................. 10-2006-0134372

(51) Int. Cl.
*G11C 7/10* (2006.01)
*G11C 7/00* (2006.01)
*G11C 8/00* (2006.01)
*G11C 8/02* (2006.01)

(52) U.S. Cl. ............. 365/189.02; 365/193; 365/230.02; 365/233.1

(58) Field of Classification Search ............ 365/189.02, 365/193, 230.02, 233.1
See application file for complete search history.

(56) References Cited

U.S. PATENT DOCUMENTS

| 5,463,635 | A | | 10/1995 | Kumazawa et al. |
| 5,787,045 | A | | 7/1998 | Lee |
| 6,061,291 | A | * | 5/2000 | Zheng .................. 365/230.06 |
| 6,115,314 | A | * | 9/2000 | Wright et al. .......... 365/230.02 |
| 6,219,292 | B1 | * | 4/2001 | Jang ........................... 365/222 |
| 6,987,705 | B2 | | 1/2006 | Kim et al. |
| 2002/0060934 | A1 | * | 5/2002 | Choi et al. .................. 365/200 |
| 2005/0105363 | A1 | | 5/2005 | Ko |
| 2005/0166097 | A1 | | 7/2005 | An |
| 2005/0201183 | A1 | | 9/2005 | Ho |

FOREIGN PATENT DOCUMENTS

| JP | 2000-057777 | 2/2000 |
| JP | 2004-246958 | 9/2004 |
| KR | 10-2005-0049236 A | 5/2005 |
| KR | 10-2005-0055228 | 6/2005 |
| KR | 10-2006-0067236 A | 6/2006 |

OTHER PUBLICATIONS

Korean Office Action, with English translation, issued in Korean Patent Application No. KR 10-2006-0134372, mailed Dec. 10, 2007.
Korean Notice of Allowance issued in Korean Patent Application No. KR 10-2006-0134372, dated Sep. 22, 2008.

* cited by examiner

*Primary Examiner*—Ly D Pham
(74) *Attorney, Agent, or Firm*—McDermott Will & Emery LLP

(57) ABSTRACT

A semiconductor memory device includes a clock period detector, a column address enable signal generator, and a multiplexing circuit. The clock period detector detects a period of an external clock in response to a pulse width information signal having a pulse width corresponding to that of the external clock. The column address enable signal generator generates a column address enable signal activated in response to a column access signal. The multiplexing circuit multiplexes points of time of inactivation of the column access signal in response to the detected signal outputted from the clock period detector.

12 Claims, 4 Drawing Sheets

COLUMN ADDRESS ENABLE SIGNAL GENERATION CIRCUIT FOR SEMICONDUCTOR MEMORY DEVICE

CROSS-REFERENCE TO RELATED APPLICATION

The present invention claims priority of Korean patent application number 10-2006-0134372, filed on Dec. 27, 2006, which is incorporated by reference in its entirety.

BACKGROUND OF THE INVENTION

The present invention relates to semiconductor design technologies; and, more particularly, to a column address enable signal generation circuit for a semiconductor memory device. More specifically, the present invention is directed to a column address enable signal generation circuit for use in a semiconductor memory device, which is capable of adjusting the pulse width of a column address enable signal to be equivalent to that of an external clock applied to the memory device.

Generally, in a semiconductor memory device such as a DRAM (Dynamic Random Access Memory), a read path for outputting data stored in cells is as follows.

First, a plurality of cells belonging to a word line WL selected by a row address selection signal is amplified by a bit line sense amp (BLSA).

Next, any one of a plurality of bit lines BLs connected to each of the cells amplified is selected by a column address selection signal.

Data carried on the selected bit line BL is outputted by passing through a segment input/output line SIO, a local input/output line (LIO) and a global input/output line GIO. And, data carried on the global input/output line GIO is provided to the outside of the semiconductor memory device through a data pad DQ.

As in the read path of DRAM set forth above, the column address selection signal is used to select any one of the plurality of bit lines BLs included in the selected word line WL when performing the write or read operation in which DRAM carries data on the bit line BL or takes it therefrom.

Therefore, it is necessary that the column address signal be activated by sensing the time when such a write or read operation to carry data on the bit line BL or take it therefrom is to be done.

A column address enable signal controls the activation and inactivation of the column address selection signal. A circuit for generating such a column address enable signal is given below.

FIG. 1 is a circuit diagram showing a conventional column address enable signal generation circuit used in a semiconductor memory device.

Referring to FIG. 1, the conventional column address enable signal generation circuit is provided with a column access signal output circuit 100 for outputting a column access signal CSA in response to a plurality of column access operation mode enable signals IRDP, IWTP, and CASP, a first rising edge sensor 102 for sensing a rising edge of the column access signal CSA, a second rising edge sensor 104 for sensing a rising edge of a return signal RET, a column address enable signal output circuit 106 for outputting a column address enable signal YAE that is activated in response to an output signal of the first rising edge sensor 102 and inactivated in response to an output signal of the second rising edge sensor 104, and a delay circuit 108 for taking and delaying a feedback signal FDB from the column address enable signal output circuit 106 by a preset time period to provide a delayed signal as the return signal RET.

The operation of the conventional column address enable signal generation circuit will now be described on the basis of the above-mentioned configuration.

First of all, when the column access signal CSA is activated in response to activation of any one of the plurality of column access operation mode enable signals IRDP, IWTP and CASP, it is the time that the column address enable signal YAE should be activated.

Therefore, the first rising edge sensor 102 senses a rising edge of the column access signal CSA, and outputs a signal having a very short preset activation time of, e.g., 1 ps ($10^{-12}$ sec), and being toggled.

In response to the toggling of the signal from the first rising edge sensor 102, the column address enables signal output circuit 106 activates the column address enables signal YAE.

At the same time, the feedback signal FDB from the column address enable signal output circuit 106 is also activated and delayed by a preset sufficient time period of, e.g., 1 ns ($10^{-9}$ sec), set by the delay circuit 108, and then provided as the return signal RET.

In addition, a rising edge of the return signal RET activated is sensed by the second rising edge sensor 104 which outputs a signal having a very short preset activation time of, e.g., 1 ps, and being toggled.

In response to the toggling of the signal from the second rising edge sensor 104, the column address enables signal output circuit 106 to inactivate the column address enables signal YAE.

In other words, the column address enable signal YAE is activated in response to activation of any one of the plurality of column access operation mode enable signals IRDP, IWTP and CASP, and inactivated after maintaining the activation interval for a preset time period set by the delay circuit 108 immediately after activation.

Therefore, the above-discussed column address signal generation circuit outputs the column address enable signal YAE having a constant activation interval. In other words, a column address selection signal has a constant pulse width.

By the way, the pulse width of the column address selection signal means a time period for which data is transmitted and received between the bit line BL and the local input/output line LIO for the write or read operation in a DRAM.

Therefore, if the pulse width of the column address selection signal is wide, it means that data can be transmitted and received for a sufficient time period between the bit line BL and the local input/output line LIO for the write or read operation in the DRAM.

However, this implies that a TAA time is long, wherein the TAA time denotes a time for which the DRAM can most quickly process a series of operations until the result is outputted in response to a read or write command of data inputted thereto.

On the contrary, if the pulse width of the column address selection signal is narrow, the TAA time is advantageous, while the time for which data is transmitted and received between the bit line BL and the local input/output line LIO is reduced.

Like this, the time for which data can be transmitted and received between the bit line BL has a trade-off relationship with the local input/output line LIO and the TAA time, which are dependent on the pulse width of the column address selection signal.

Thus, the data input/output operation of the DRAM can be stabilized only when the pulse width of the column address selection signal has a suitable pulse width that matches an operating frequency of an external clock provided from the outside of the DRAM.

However, the conventional column address enable signal generation circuit described referring to FIG. 1 provides the column address selection signal having a constant pulse width.

If the pulse width of the column address selection signal having a constant pulse width as above is determined for high frequency operation of DRAM, the time for which data is transmitted and received between the bit line BL and the local input/output line LIO is reduced, which may cause a timing mismatch in the DRAM that operates at a low frequency.

On the contrary, if the pulse width of the column address selection signal having a constant pulse width is determined for low frequency operation of the DRAM, the TAA time of the DRAM is lengthened, which may raise fail of data input/output in the DRAM that operates at a high frequency.

SUMMARY OF THE INVENTION

Embodiments of the present invention are directed to providing a semiconductor memory device controlling a column address enable time in response to a pulse width of an external clock.

In accordance with an aspect of the present invention, there is provided a semiconductor memory device including a clock period detector, a column address enable signal generator, and a multiplexing circuit. The clock period detector detects a period of an external clock in response to a pulse width information signal having a pulse width corresponding to that of the external clock. The column address enable signal generator generates a column address enable signal activated in response to a column access signal. The multiplexing circuit multiplexes points of time of inactivation of the column access signal in response to the detected signal outputted from the clock period detector.

DESCRIPTION OF SPECIFIC EMBODIMENTS

Figure 1:
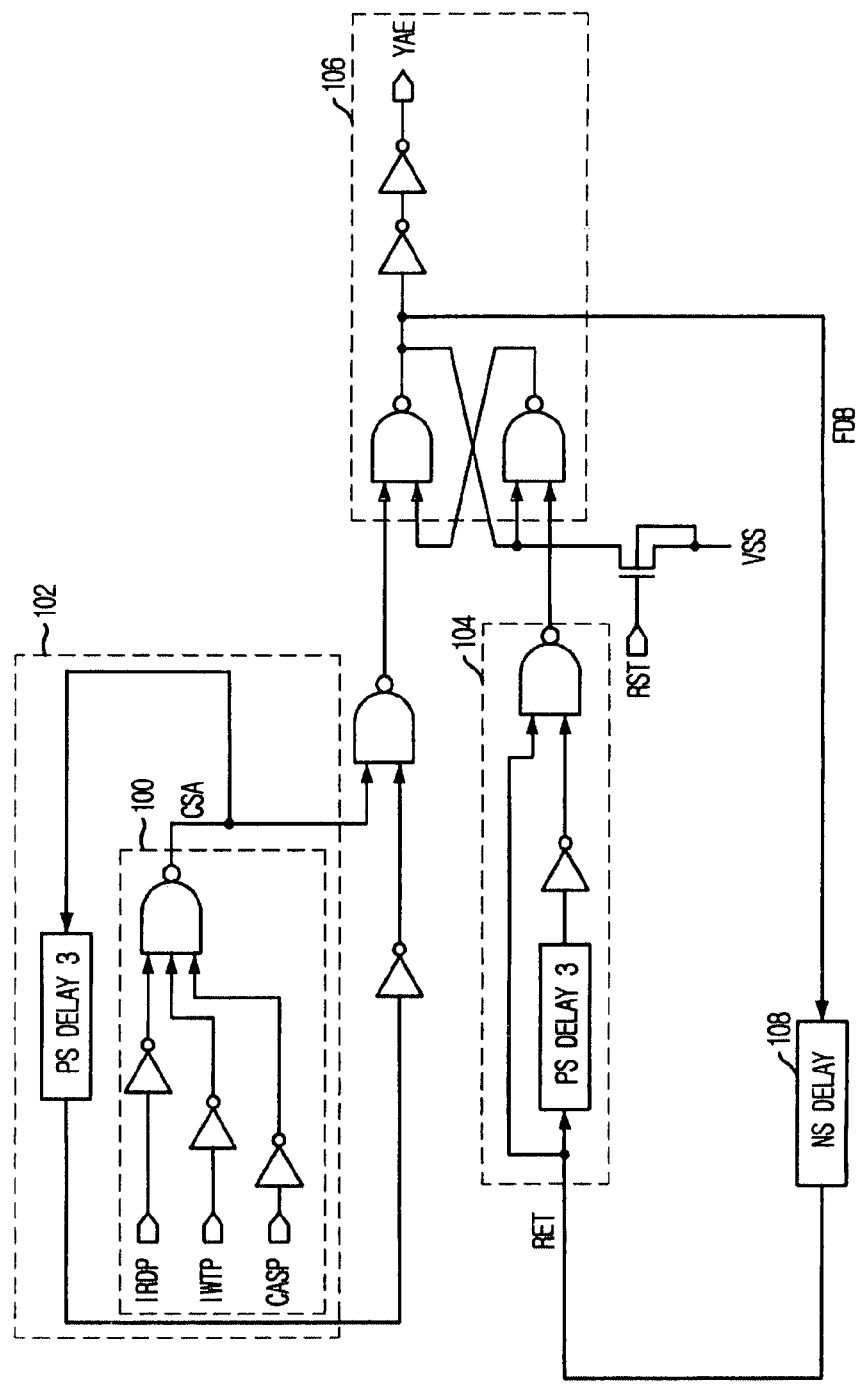
FIG. 1 is a circuit diagram showing a conventional column address enable signal generation circuit used in a semiconductor memory device.

Hereinafter, a preferred embodiment of the present invention will be described in detail with reference to the accompanying drawings so that the invention can be easily carried out by those skilled in the art to which the invention pertains. Further, the same reference numerals are denoted for the same components throughout the specification.

Figure 2:
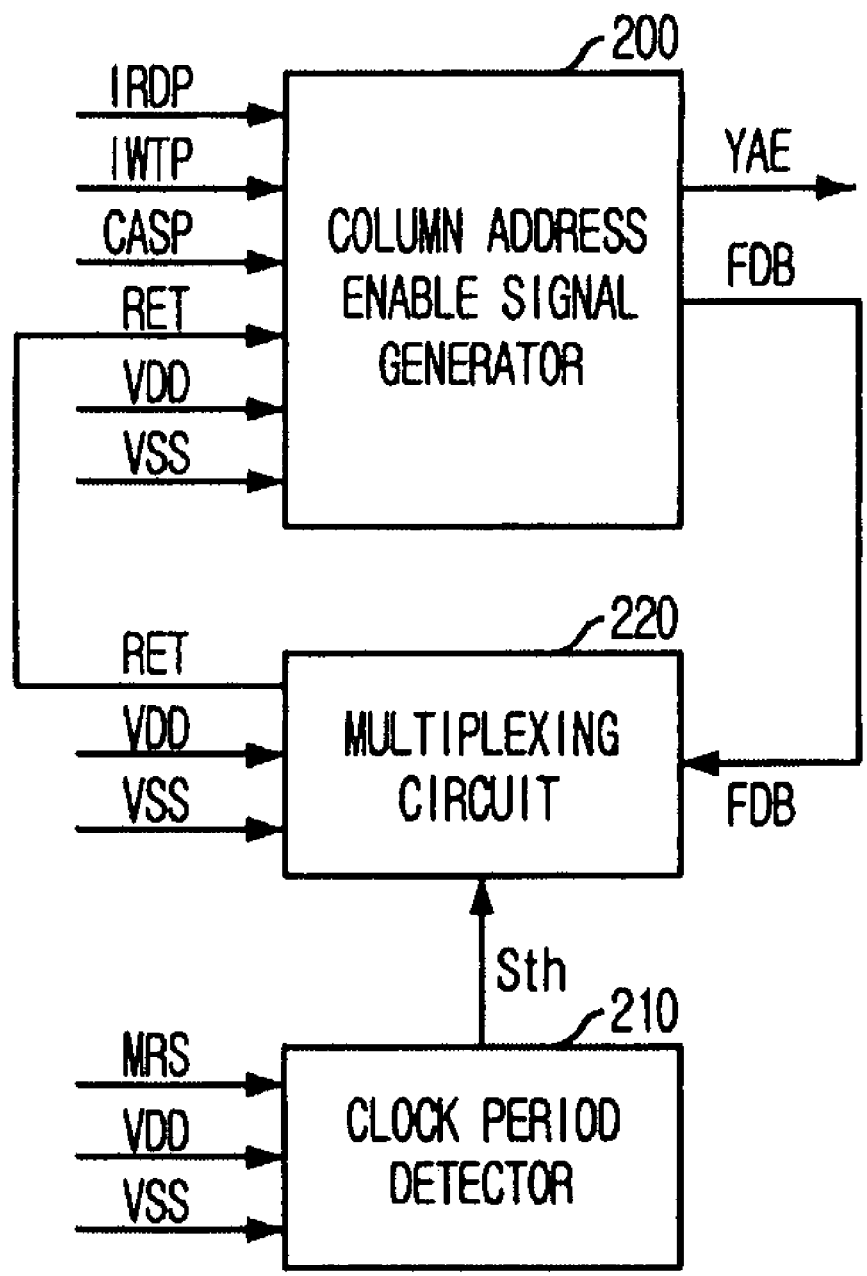
FIG. 2 illustrates a block circuit diagram of a column address enable signal generation circuit for use in a semiconductor memory device in accordance with a preferred embodiment of the present invention.

FIG. 2 illustrates a block circuit diagram of a column address enable signal generation circuit for use in a semiconductor memory device in accordance with a preferred embodiment of the present invention.

Referring to FIG. 2, the column address enable signal generation circuit of the present invention includes a clock period detector 210 for detecting a period of an external clock in response to a pulse width information signal which has a pulse width corresponding to that of the external clock and uses an MRS (Mode Register Set) signal in the present invention, a column address enable signal generator 200 for generating a column address enable signal YAE activated in response to a column access signal CSA, and a multiplexing circuit 220 having a plurality of delay elements DELAY 1 and DELAY 2 for multiplexing points of time of inactivation of the column access signal CSA in response to a detected signal Sth outputted from the clock period detector 210.

Figure 3A:
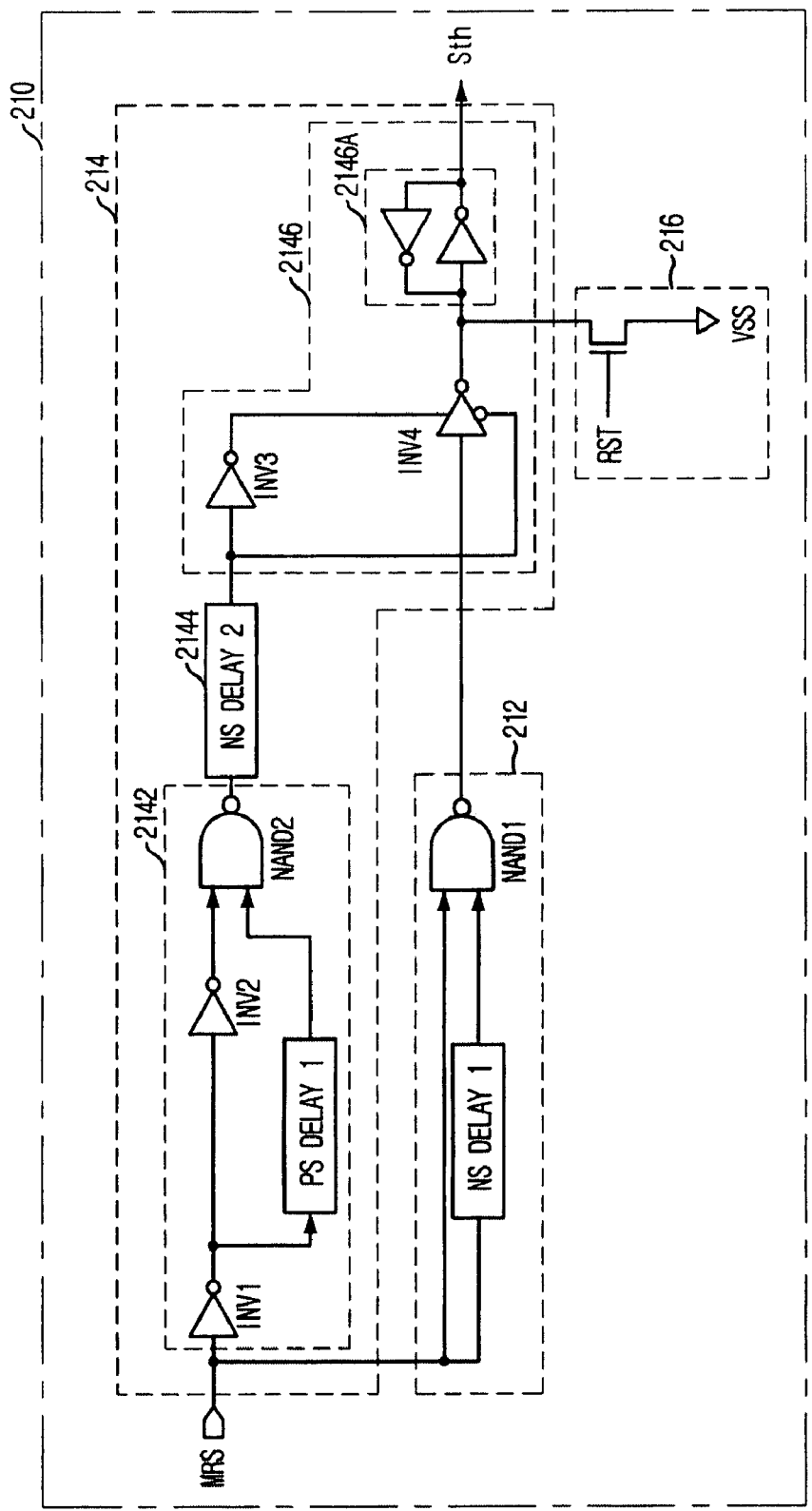
FIG. 3A shows a detailed circuit diagram of the clock period detector among the components of the column address enable signal generation circuit depicted in FIG. 2.

FIG. 3A shows a detailed circuit diagram of the clock period detector 210 among the components of the column address enable signal generation circuit depicted in FIG. 2.

Referring to FIG. 3A, the clock period detector 210 is provided with a pulse width comparator 212 for comparing a pulse width of the pulse width information signal MRS with a preset pulse width of 1 ns to determine whether or not the pulse width of the pulse width information signal MRS is longer than 1 ns, and an output switching circuit 214 for switching an output signal of the pulse width comparator 212 to the detected signal Sth at a preset time meaning a time period that takes until the comparison result of the pulse width comparator 212 is outputted. In addition, it is further provided with an initializing circuit 216 for initializing a logic level of the detected signal Sth at an initial operation of the memory device.

Here, the pulse width comparator 212 is composed of a delay element NS DELAY 1 for receiving and delaying the pulse width information signal MRS by a time period corresponding to the preset pulse width, and a NAND gate NAND1 for accepting and NAND-operating the pulse width information signal MRS and an output signal of the delay element NS DELAY 1.

The output switching circuit 214 is composed of a rising edge sensor 2142 for sensing a rising edge of the pulse width information signal MRS, a delay element NS DELAY 2 2144 for delaying an output signal of the rising edge sensor 2142 by a time period corresponding to the preset pulse width, and a switching controller 2146 for controlling the switching of the output signal of the pulse width comparator 212 to the detected signal Sth in response to an output signal of the delay element NS DELAY 2 2144.

Here, the rising edge sensor 2142 is composed of a first inverter INV1 for inverting the pulse width information signal MRS, a second inverter INV2 for inverting an output signal of the first inverter INV1, a delay element PS DELAY 1 for delaying an output signal of the first inverter INV1 by a preset time period of several ps shorter than a time period corresponding to the preset pulse width of 1 ns, and an NAND gate NAND2 for taking and NAND-operating an output signal of the second inverter INV2 and an output signal of the delay element PS DELAY 1.

The switching controller 2146 is composed of a first inverter INV3 for inverting an output signal of the delay element 2144 a second inverter INV4 for inverting an output signal of the pulse width comparator 212 inputted in response to an output signal of the delay element 2144 and an output signal of the first inverter INV3, and a latch 2146A for inverting an output signal of the second inverter INV4 to output an inverted signal as the detected signal Sth and preventing floating of the detected signal Sth.

Figure 3B:
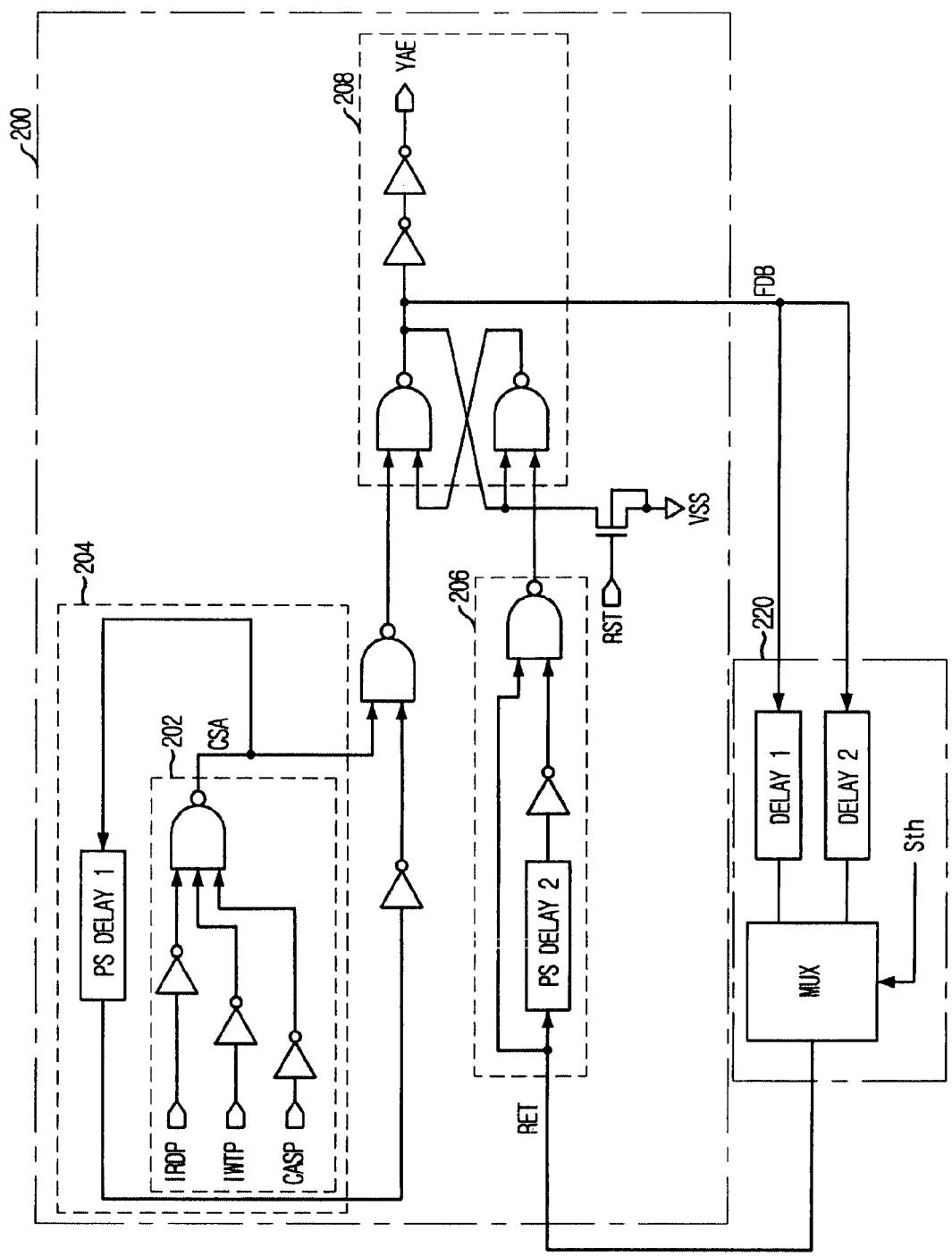
FIG. 3B shows a detailed circuit diagram of the column address enable signal generator and the multiplexing circuit among the components of the column address enable signal generation circuit depicted in FIG. 2.

FIG. 3B shows a detailed circuit diagram of the column address enable signal generator 200 and the multiplexing circuit 220 among the components of the column address enable signal generation circuit depicted in FIG. 2.

Referring to FIG. 3B, the column enable signal generator 200 is composed of a column access signal output circuit 202 for outputting the column access signal CSA in response to a plurality of column access operation mode enable signals IRDP, IWTP and CASP, a first rising edge sensor 204 for sensing a rising edge of the column access signal CSA, a second rising edge sensor 206 for sending a rising edge of a return signal RET, and a column address enable signal output circuit 208 for outputting the column address enable signal YAE that is activated in response to an output signal of the first rising edge sensor 204 and inactivated in response to an output signal of the second rising edge sensor 206.

The multiplexing circuit 220 is composed of a first delay element DELAY 1 for taking and delaying a feedback signal FDB from the column address enable signal output circuit 208 by a first preset time period, a second delay element DELAY 2 for delaying the feedback signal FDB from the column address enable signal output circuit 208 by a second preset time period, and a multiplexer MUX for selecting one of output signals of the first delay element DELAY 1 and the second delay element DELAY 2 and providing the selected signal as the return signal RET.

Now, the operation of the column address enable signal generation circuit for the semiconductor memory device of the present invention will be described in detail on the basis of the configuration set forth above.

For reference, since the operation of the column address enable signal generator 200 is explained in the prior art section, it is omitted here for simplicity.

First, the clock period detector 210 starts to operate after DRAM is initialized, and determines a level of the detected signal Sth in response to the pulse width information signal MRS inputted thereto.

At this time, among the components of the clock period detector 210, the pulse width comparator 212 outputs a pulse signal being toggled to a logic low level if the pulse width of the pulse width information signal MRS applied thereto is wider than the preset pulse width.

However, if the pulse width of the pulse width information signal MRS applied thereto is narrower than the preset pulse width, the pulse width comparator 212 outputs a signal having a logic high level continuously maintained.

Further, the output signal of the pulse width comparator 212 is provided as the detected signal Sth at the time when the comparison result of the pulse width comparator 212 is outputted from the output switching circuit 214.

The detected signal 5th that is level-determined is used to control the operations of selecting one of the plurality of delay elements DELAY 1 and DELAY 2 included in the multiplexing circuit 220 and output the signal passed through the selected delay element from the multiplexing circuit 220.

The column address enable signal YAE, which was activated in response to the column access signal CSA in the column address enable signal generator 200, is inactivated after the activation interval corresponding to the delay time selected by the detected signal Sth in the multiplexing circuit 220.

As mentioned above, with the embodiment of the invention, if the frequency of the external clock of DRAM is varied, the present invention senses the status and controls the creation of the column address enable signal having a pulse width corresponding to the varied frequency, thereby stably operating DRAM.

In other words, it is possible to prevent malfunctioning of DRAM that may occur due to the column address selection signal having a fixed pulse width by varying the pulse width of the column address selection signal depending on the frequency of the external clock.

Even though the above-stated embodiment multiplexes activation intervals of the column address enable signal with two kinds of delay elements, the present invention may also be applied to the case of multiplexing activation intervals of the column address enable signal with more than two delay elements.

It should be noted that the logic gates and transistors illustrated in the aforementioned embodiment may be implemented in different types and arrangements based on the polarities of input signals.

As a result, even in case the frequency of an external clock of DRAM is varied, the present invention senses the status and controls that the column address enable signal has a pulse width corresponding to the varied frequency of the external clock by a detected signal having a varying level, thereby making the data input/output operation of DRAM stably done.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a clock period detector for detecting a period of an external clock in response to a pulse width information signal having a pulse width corresponding to that of the external clock;
   a column address enable signal generator for generating a column address enable signal activated in response to a column access signal; and
   a multiplexing circuit for multiplexing points of time of inactivation of the column access signal in response to the detected signal outputted from the clock period detector.

2. The semiconductor memory device as recited in claim 1, wherein the clock period detector includes:
   a pulse width comparator for comparing a pulse width of the pulse width information signal with a preset pulse width; and
   an output switching circuit for switching an output signal of the pulse width comparator to the detected signal at a preset time.

3. The semiconductor memory device as recited in claim 2, wherein the clock period detector further includes an initializing circuit for initializing a logic level of the detected signal at an initial operation of the memory device.

4. The semiconductor memory device as recited in claim 2, wherein the pulse width comparator includes:
   a first delay element for taking and delaying the pulse width information signal by a time period corresponding to the preset pulse width; and
   a NAND gate for NAND-operating the pulse width information signal and an output signal of the first delay element.

5. The semiconductor memory device as recited in claim 2, wherein the output switching circuit includes:
   a first rising edge sensor for sensing a rising edge of the pulse width information signal;
   a second delay element for delaying an output signal of the first rising edge sensor by a time period corresponding to the preset pulse width; and a switching controller for controlling the switching of the output signal of the pulse width comparator to the detected signal in response to an output signal of the delay circuit.

6. The semiconductor memory device as recited in claim 5, wherein the first rising edge sensor includes:
   a first inverter for inverting the pulse width information signal;
   a second inverter for inverting an output signal of the first inverter;
   a third delay element for delaying an output signal of the first inverter by a preset time period shorter than a time period corresponding to the preset pulse width; and
   a NAND gate for NAND-operating an output signal of the second inverter and an output signal of the third delay element.

7. The semiconductor memory device as recited in claim 5, wherein the switching controller includes:
   a third inverter for inverting an output signal of the delay circuit;
   a fourth inverter for inverting an output signal of the pulse width comparator inputted in response to an output signal of the delay element and an output signal of the third inverter; and
   a latch for inverting an output signal of the fourth inverter to output an inverted signal as the detected signal, and preventing floating of the detected signal.

8. The semiconductor memory device as recited in claim 7, wherein the pulse width information signal denotes an mode register set (MRS) signal.

9. The semiconductor memory device as recited in claim 7, wherein the preset time period corresponding to the preset pulse width is 1 ns.

10. The semiconductor memory device as recited in claim 1, wherein the column enable signal generator includes:
    a column access signal output circuit for outputting the column access signal in response to a plurality of column access operation mode enable signals;
    a second rising edge sensor for sensing a rising edge of the column access signal;
    a third rising edge sensor for sending a rising edge of a return signal; and
    a column address enable signal output circuit for outputting the column address enable signal that is activated in response to an output signal of the second rising edge sensor and inactivated in response to an output signal of the third rising edge sensor.

11. The semiconductor memory device as recited in claim 10, wherein the multiplexing circuit delays a feedback signal from the column address enable signal output circuit by a time period corresponding to any one of the plurality of delay elements, and outputs a delayed signal as the return signal.

12. The semiconductor memory device as recited in claim 10, wherein the multiplexing circuit includes:
    a fourth delay element for delaying the feedback signal from the column address enable signal generator by a first preset time period;
    a fifth delay element for delaying the feedback signal from the column address enable signal generator by a second preset time period; and
    a multiplexer for selecting one of output signals of the fourth delay element and the fifth delay element and providing the selected signal as the return signal.

* * * * *